(12) United States Patent
Lee

(10) Patent No.: US 6,855,616 B2
(45) Date of Patent: Feb. 15, 2005

(54) METHODS FOR MANUFACTURING SEMICONDUCTOR DEVICES

(75) Inventor: Young Seong Lee, Anyang-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/694,489

(22) Filed: Oct. 27, 2003

(65) Prior Publication Data

US 2004/0126930 A1 Jul. 1, 2004

(30) Foreign Application Priority Data

Dec. 28, 2002 (KR) .............................. 10-2002-0085869

(51) Int. Cl.$^7$ .............................................. H01L 21/76
(52) U.S. Cl. ..................................... 438/424; 438/221
(58) Field of Search .................................. 438/221, 296, 438/424, 702, 427–428; 11/435–437

(56) References Cited

U.S. PATENT DOCUMENTS

| | | | | |
|---|---|---|---|---|
| 5,731,241 A | * | 3/1998 | Jang et al. .................... | 438/424 |
| 6,180,490 B1 | * | 1/2001 | Vassiliev et al. ............. | 438/424 |
| 6,235,608 B1 | * | 5/2001 | Lin et al. ..................... | 438/424 |
| 6,562,734 B2 | * | 5/2003 | Kirchhoff .................... | 438/788 |

* cited by examiner

Primary Examiner—David Nelms
Assistant Examiner—David Vu
(74) Attorney, Agent, or Firm—Hanley, Flight & Zimmerman, LLC

(57) ABSTRACT

A method of producing a semiconductor device, wherein after a trench is formed on a field region of a semiconductor substrate, an adsorption reaction of TEOS and a decomposition/recomposition reaction of TEOS using as a catalyst oxygen atoms decomposed from $O_3$ are independently and repeatedly performed. As disclosed, the oxide layer can be buried in the trench with a fine width without generating voids therein, increasing electrical property of the semiconductor device.

7 Claims, 7 Drawing Sheets

METHODS FOR MANUFACTURING SEMICONDUCTOR DEVICES

TECHINICAL FIELD

The present disclosure relates to semiconductor device manufacturing and, more particularly, to methods for manufacturing semiconductor devices.

BACKGROUND

Generally, Local Oxidation of Silicon (LOCOS) using a nitride layer has been employed as an isolation technique in the manufacture of semiconductor devices. However, because there are some shortcomings associated with the LOCOS process, new isolation technologies and techniques have been developed. Among the new isolation technologies and techniques are Poly Buffer LOCOS, Recessed LOCOS (R-LOCOS), which have been widely used. These isolation technologies, however, have drawbacks because they are complicated and result in an undesired phenomenon referred to as bird's beak in which inroads are made into an active region by a silicon oxide layer. The drawbacks of these technologies limit the density at which semiconductor devices can be integrated, resulting in a limit of high-integration of the semiconductor device. Furthermore, because a step or surface height differential between the surface of an active region in a silicon substrate and the surface of an oxide layer of a field region is generated, the known isolation techniques typically require a planarization process to be successively performed to reduce the step between the surfaces of the regions.

Recently, an improved Shallow Trench Isolation (STI) process has been introduced. The STI process is advantageous in that it results in excellent isolation properties and occupies a small area so that the STI process may be used in high-integration of semiconductor devices, as compared to a conventional isolation technology.

STI process is performed by forming a trench on a field region of a semiconductor substrate; the trench is then filled with an oxide layer using a Gap Filling process. A Chemical Mechanical Polishing (CMP) is then used to planarize the oxide layer in the trench and the semiconductor substrate, resulting in a field oxide layer that is formed on the field region of the semiconductor substrate. The oxide layer is generally formed using an $O_3$-Tetra-Ethyl-Ortho-Silicate (TEOS) Atmospheric Pressure Chemical Vapor Deposition (APCVD) oxide layer, and a High Density Plasma Chemical Vapor Deposition (HDP CVD) oxide layer. The resulting layer has excellent gap filling and planarization properties.

A conventional STI process will now be described in conjunction with FIG. 1. As shown in FIG. 1, for instance, a multi-insulating layer comprising an oxide layer 11, a nitride layer 13, and an oxide layer 15 are deposited on a front face of a semiconductor substrate 10, which may be a single crystal silicon substrate. Herein, the thickness of the oxide layer 11 is 25 to 200 Å and that of the nitride layer 13 is 1000 to 2000 Å. Then, using a photolithography, a common opening 16 of the oxide layer 11, nitride layer 13, and oxide layer 15 is formed on the field region of the semiconductor substrate 10. Then, using the oxide layer 11, nitride layer 13, and oxide layer 15 as an etching mark layer, the field region of the semiconductor substrate 10 is etched in a desired depth of 3000 to 4000 Å, forming a trench 17 on the field region of the semiconductor substrate 10.

As shown in FIG. 2, an insulating layer such as, for example, an oxide layer 19 is grown in a thickness of 300 to 400 Å on the etched surface in the trench of the semiconductor substrate 10 by a thermal oxidation process. This is performed so as to recover the damaged silicon lattices in the trench 17 in the semiconductor substrate 10 and to restrict leakage current in the oxide layer 21 of FIG. 3 when the oxide layer 21 is buried in the trench 17.

As shown in FIG. 3, using $O_3$-TEOS CVD process, the oxide layer 21 is deposited in a thickness required for burying the trench 17, for example, 5000 to 6000 Å. Of course, instead of the $O_3$-TEOS CVD process, HDP CVD or Low Pressure CVD process can be used.

As is not shown in the drawings, using a conventional CMP process, the oxide layer 21 is planarized and the oxide layer 15, nitride layer 13 and oxide layer 11 all are etched to expose the surface of the active region of the semiconductor substrate 10, thus completing STI process.

In the prior art, the $O_3$-TEOS CVD process is performed by introducing TEOS in a reactor having a temperature of 500 to 600° C. and an atmosphere of $O_3$ so that TEOS is decomposed using an $O_3$ catalyst and a selective deposition of the decomposed object is performed to the surface, thus burying the oxide layer 21 in the trench 17.

However, since the conventional $O_3$-TEOS CVD process is performed in a high temperature of 500 to 600° C. and a high pressure of more than 200 torr, a surface reaction and a vapor phase reaction are simultaneously occurred in the $O_3$ atmosphere. Accordingly, the conventional $O_3$-TEOS CVD process has a poor gap-filling capacity. Thus, the narrower a width of the trench is, the more difficult it is to bury the oxide layer in the trench without generating voids in the trench.

Meanwhile, HDP CVD process, in which an oxide layer is buried in a trench by etching the oxide layer using a plasma deposition or a sputtering, has a burying property superior to that of $O_3$-TEOS CVD process through a combination of a control of velocities of deposition and etching and the whole conditions. However, the HDP CVD process has drawbacks that burying property thereof is dependent upon a shape of trench as the width of trench is narrower and a possibility of damage by plasma is increased.

As described above, the conventional method faces a limit in filling a trench as the trench is narrower.

DETAILED DESCRIPTION

Figure 1:
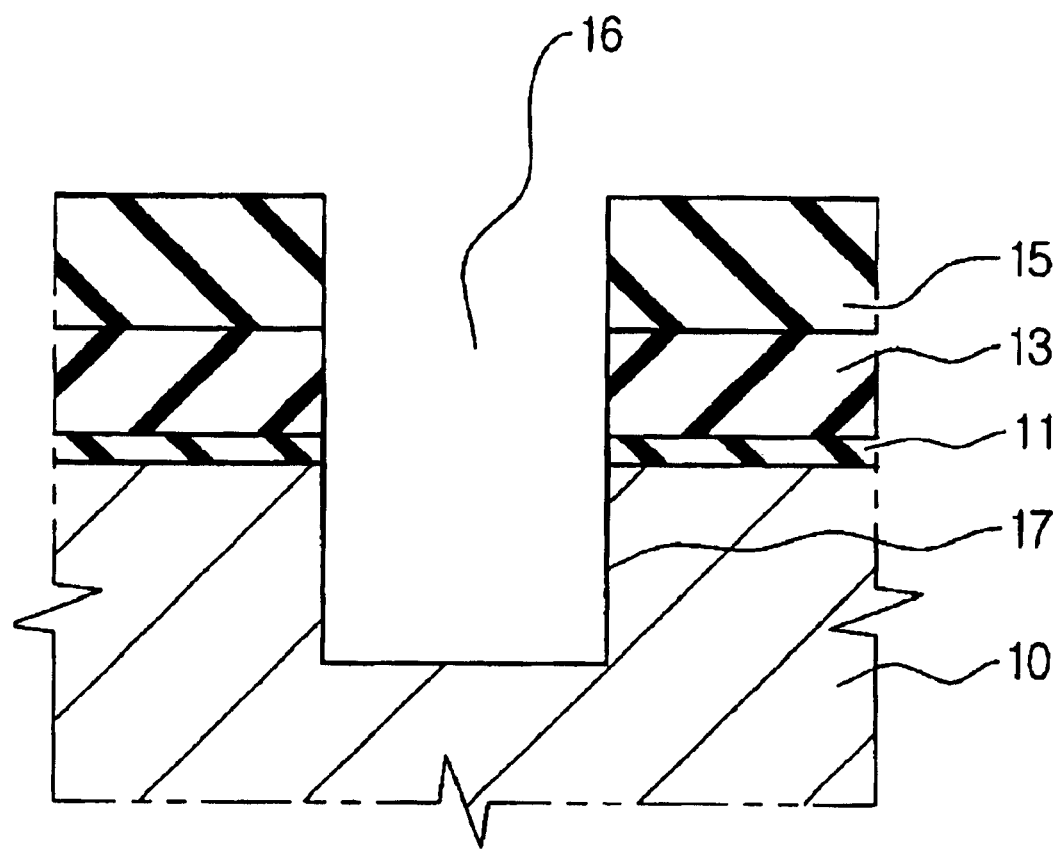
FIGS. 1 to 3 are cross-sectional views showing the Shallow Trench Isolation (STI) process according to the prior art.
Figure 2:
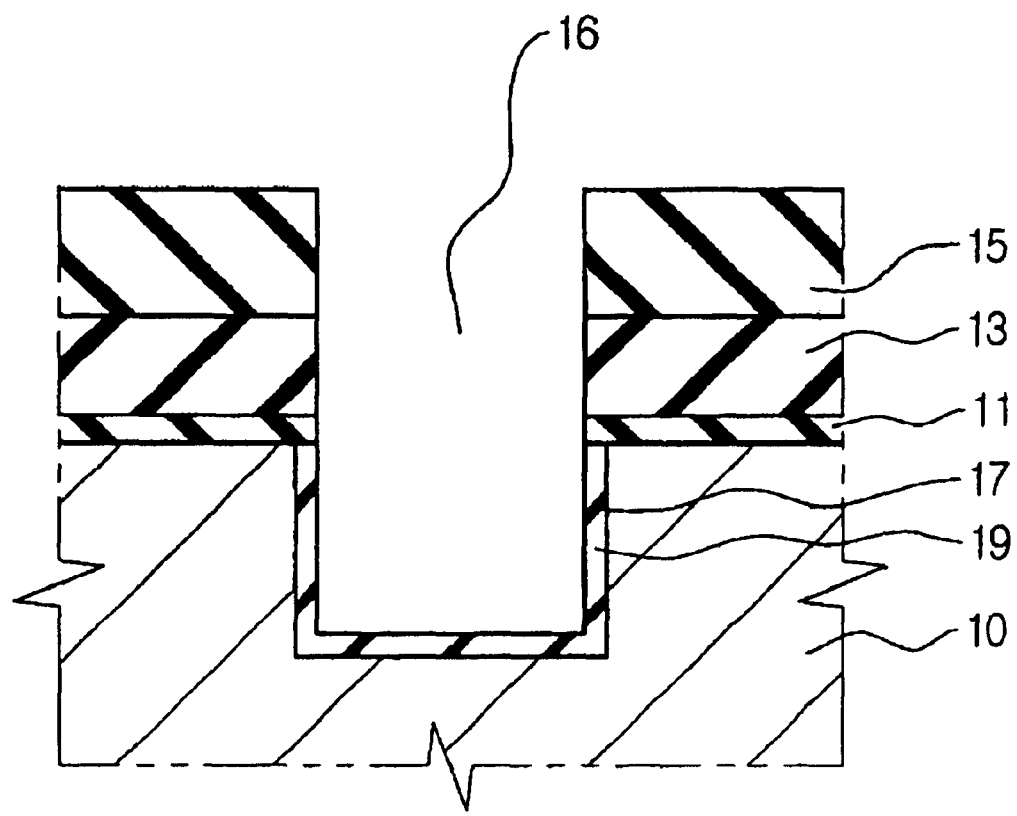
Figure 3:
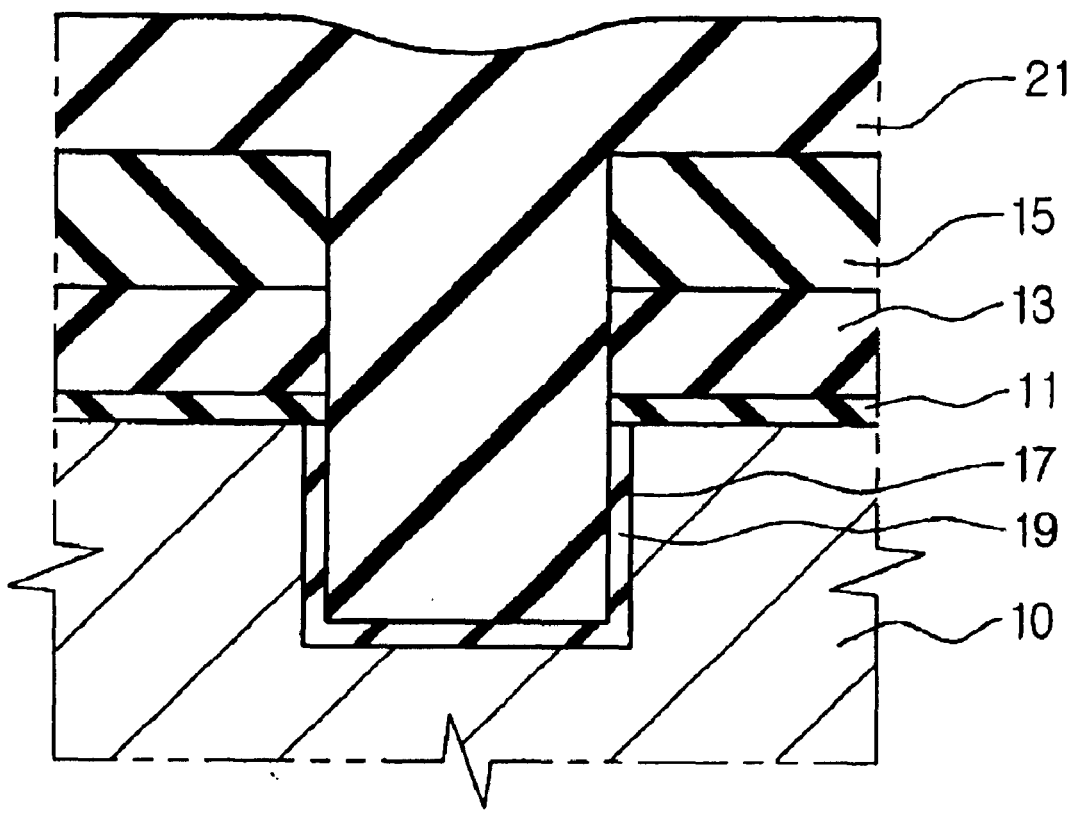

Hereinafter, example methods for manufacturing semiconductor devices are disclosed with reference to the accompanying drawings. In the following description and drawings, the like reference numerals are used to designate the same or similar components and so repetition of the description of the same or similar components is omitted.

Figure 4:
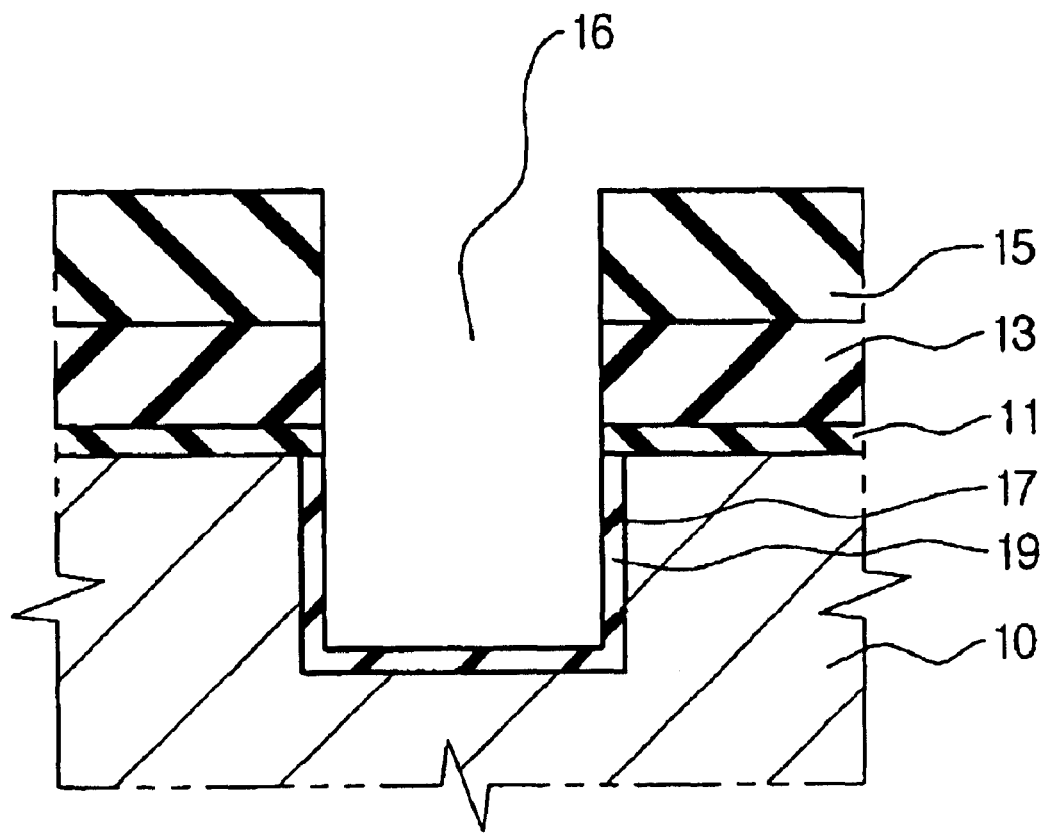
FIGS. 4 to 7 are cross-sectional views showing a Shallow Trench Isolation (STI) process adapted to a disclosed semiconductor device manufacturing method.

Referring to FIG. 4, a multi-insulating layer comprising an oxide layer 11, a nitride layer 13, and an oxide layer 15 is deposited on a front face of a semiconductor substrate 10, which may be, for example, a single crystal silicon substrate. In one example, the oxide layer 11 may have a thickness 25 to 200 Å and the nitride layer 13 may have a thickness of 1000 to 2000 Å. Then, using a photolithography, a common opening 16 of the oxide layer 11, nitride layer 13, and oxide layer 15 is formed on the field region of the semiconductor substrate 10. Then, using the oxide layer 11, nitride layer 13, and oxide layer 15 as an etching mask layer, the field region of the semiconductor substrate 10 is etched in a desired depth such as, for example, 3000 to 4000 Å, which forms a trench 17 on the field region of the semiconductor substrate 10.

After the trench 17 is formed, an insulating layer such as, for example, an oxide layer 19 is grown in a thickness of 300 to 400 Å on the etched surface in the trench 17 of the semiconductor substrate 10. The growth may be performed using a thermal oxidation process to recover the damaged silicon lattices in the trench 17 in the semiconductor substrate 10 and to restrict leakage current in the oxide layer 21 of FIG. 6 when the oxide layer 21 is buried in the trench 17.

Figure 5:
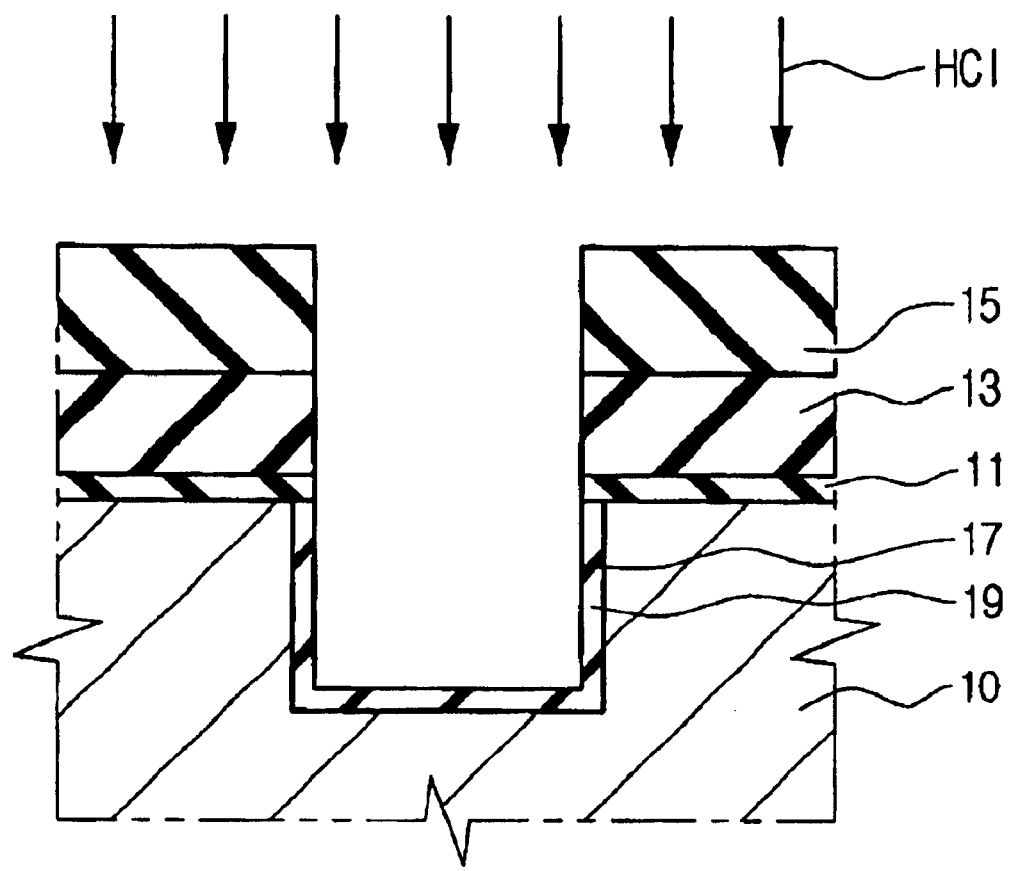

Referring to FIG. 5, using a wet cleaning with, for example, an HCl solution, any organic substance possibly remaining in the semiconductor substrate 10 is removed. This is performed to make a surface state of the trench 17 chemically uniform before deposition of the oxide layer 21 of FIG. 6 thereon because the deposition of the oxide layer 21 of FIG. 6 is implemented by a surface reaction.

Figure 6:
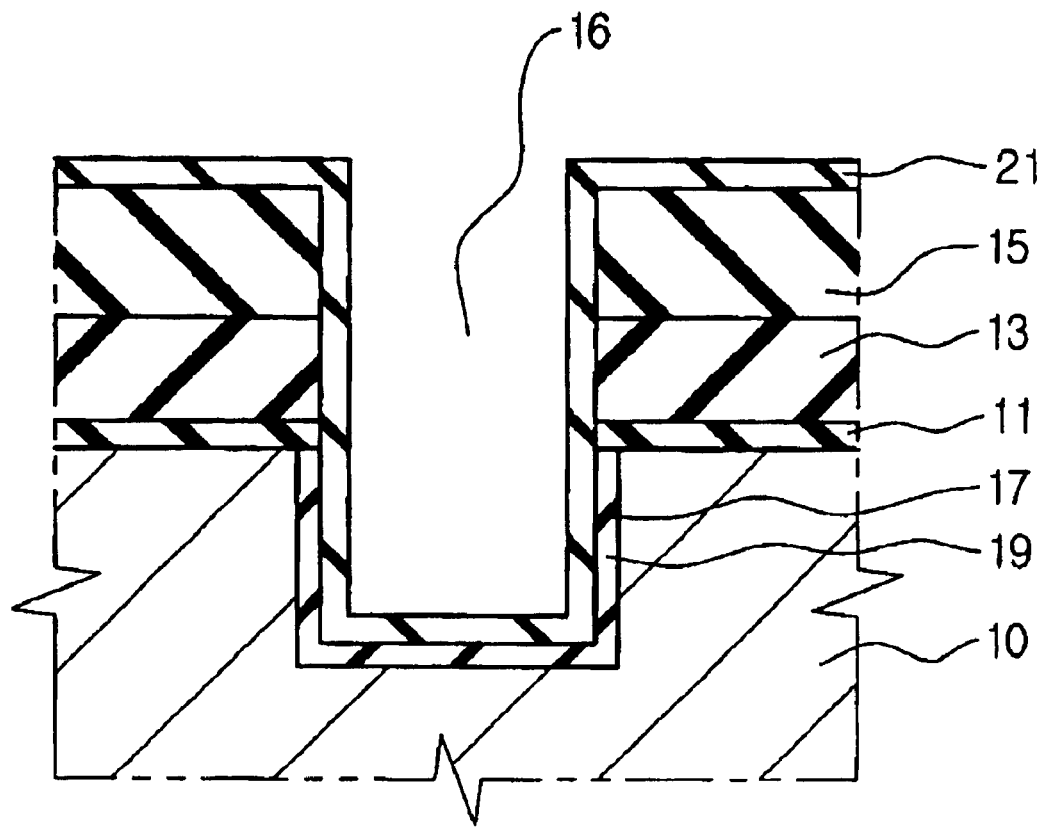

Referring to FIG. 6, the semiconductor substrate 10 is placed in a reactor (not shown) such as, for example, a reaction chamber. Then, the semiconductor substrate 10 is annealed in an atmosphere of $O_3$ for about 1 minute. During the annealing process, it is desirable to set a temperature of the reactor equal to a deposition temperature of the oxide layer 21. In one example, the deposition temperature may be between 500 and 600° C.

Figure 7:
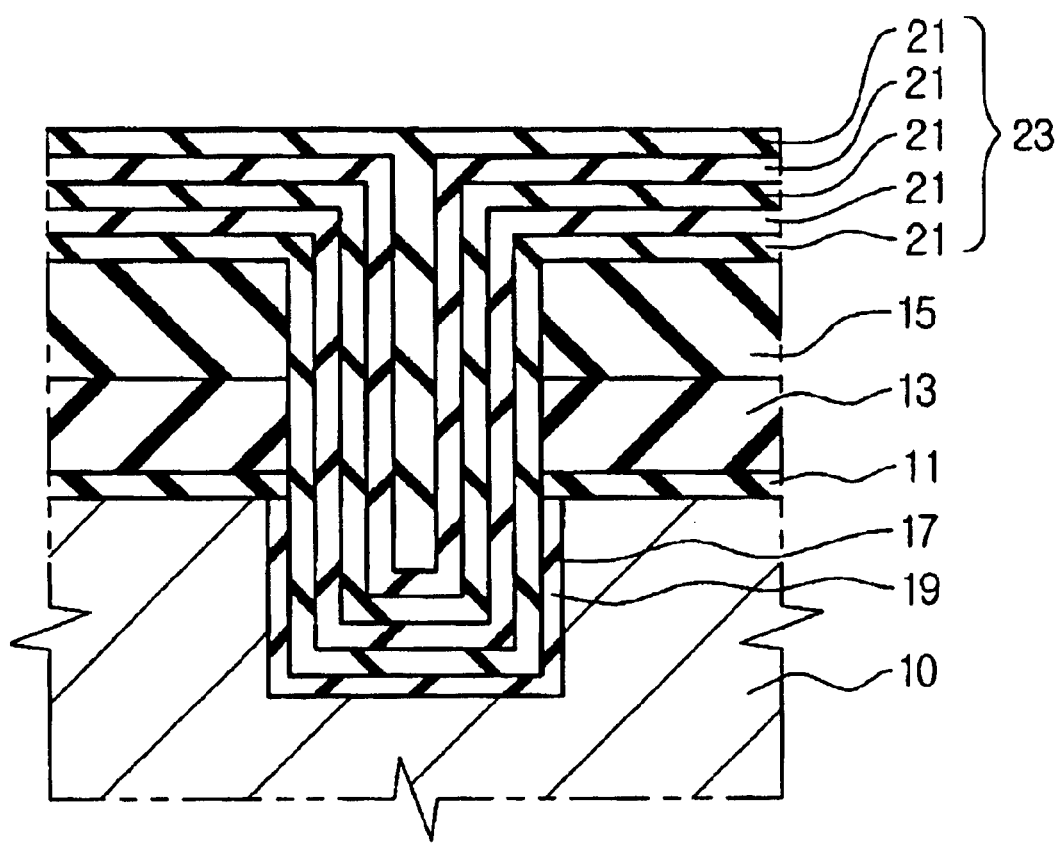

Then, to bury an oxide layer 23 of FIG. 7 in the trench 17, an atomic layered oxide layer 21 constituting the oxide layer 23 is deposited. With repetition of the deposition, a number of oxide layers 21 are buried in the trench 17.

More particularly, TEOS is introduced in the reactor, using inert gas such as Helium as carrier gas, in a condition that the temperature of the reactor is set to a high temperature of 500 to 600° C. and a pressure of the reactor is maintained at low pressure of below 10 torr. Herein, because a vapor phase reaction does not occur in TEOS, which is different from the case of the prior art, TEOS reaches the surface of the semiconductor substrate 10 without being decomposed, thus generating a surface reaction. Accordingly, TEOS is selectively adsorbed at a point where an Si—O—H bonding of the oxide layer 19 exists. Adsorption rate of TEOS is uniform because the adsorption probability of TEOS is the same in the whole surface area of the trench 17. Meanwhile, TEOS that is not adsorbed in the trench is discharged from the reactor.

Then, after an introduction of TEOS is interrupted and the pressure of the reactor is set to a base pressure, $O_3$ is introduced into the reactor. Herein, for a free movement of $O_3$ to a bottom face of the trench, the pressure of reactor is lowered about 10 torr. Accordingly, oxygen atoms decomposed from $O_3$ induce a decomposition of the adsorbed TEOS and recompose the decomposed object to form an Si—O—Si or Si—O—H bonding. Thus, the oxide layer 21 is grown that has a thickness of a few Å.

Then, an introduction of $O_3$ is interrupted and the pressure of reactor is set to a base pressure.

Referring to FIG. 7, an oxide layer 23 is deposited by repeating a unit cycle of deposition in FIG. 6 so that the plural oxide layers 21 are deposited in the trench 17, burying the oxide layer 23 in the trench 17. Herein, the deposition of oxide layer 23 is performed by repetition of surface adsorption and decomposition reaction of TEOS, and adsorption possibility of TEOS is uniform in the whole area of the trench 17, so that a step coverage of about 100% may be accomplished.

Thus, as disclosed herein, the trench is completely, or nearly completely, filled with the oxide layer without generating voids in the fine-width trench.

Though it is not shown in the drawings, the oxide layer 23 may be planarized using a conventional CMP process, and the oxide layer 15, nitride layer 13 and oxide layer 11 may be etched to expose the surface of the active region of the semiconductor substrate 10, thus completing STI process.

As disclosed herein, a plurality of oxide layers having a thickness of a few Å are deposited on the semiconductor substrate, so that the oxide layer is buried in the fine-width trench without generating voids. This results in reduced leakage currents and improved electrical properties of the oxide layer buried in the trench, and that of the semiconductor device.

As described above, a method of manufacturing semiconductor devices is provided, wherein after a trench is formed on a field region of a semiconductor substrate, an adsorption reaction of TEOS and a decomposition/recomposition reaction of TEOS using as a catalyst oxygen atoms decomposed from $O_3$ are independently and repeatedly performed. Accordingly, the disclosed method secures that the oxide layer is buried in the trench with fine width without generating voids therein, improving the electrical property of the semiconductor device, in which $O_3$-TEOS CVD or HDP CVD process is hardly adapted to the trench.

In particular, as disclosed above, the semiconductor fabrication method comprises depositing an insulating layer on a semiconductor substrate and forming an opening of the insulating layer wherein the opening exposes a field region of the semiconductor substrate, forming a trench in the semiconductor substrate on the exposed region in the opening, independently performing an adsorption reaction of TEOS and a decomposition/recomposition reaction of TEOS using O3, thus depositing an oxide layer in a thin thickness on the surface of the semiconductor substrate; and repeatedly depositing the oxide layer to bury the oxide layer in the trench.

In particular, according to one example, depositing the oxide layer comprises introducing TEOS in a reactor having a high temperature of 500 to 600° C. and a low pressure of below 100 torr to adsorbing TEOS on the semiconductor substrate, interrupting the introduction of TEOS and discharging remaining TEOS from the reactor, and providing the pressure of the reactor with a base pressure of above 100 torr and introducing $O_3$ in the reactor to decompose and recompose the adsorbed TEOS, thus depositing the oxide layer on the semiconductor substrate.

In one example, before the adsorption of TEOS, the semiconductor substrate is cleaned and annealed in a reactor using an HCl solution. The annealing may be performed in an atmosphere of $O_3$ and may be performed at a temperature of 500 to 600° C.

Although certain methods and apparatus performed and constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for manufacturing a semiconductor device, the method comprising:

depositing an insulating layer on a semiconductor substrate;

forming an opening of the insulating layer exposing a field region of the semiconductor substrate;

forming a trench in the semiconductor substrate on the exposed region in the opening;

performing independently an adsorption reaction of TEOS and a decomposition/recomposition reaction of TEOS using $O_3$, thus depositing an oxide layer in a thin thickness on the surface of the semiconductor substrate; and depositing repeatedly the oxide layer to bury a plurality of the oxide layer in the trench.

2. A method as defined by claim 1, wherein depositing the oxide layer comprises:

introducing TEOS in a reactor having a high temperature of 500 to 600° C. and a low pressure of below 100 torr to adsorb TEOS on the semiconductor substrate;

interrupting the introduction of TEOS and discharging remaining TEOS from the reactor, and providing the pressure of the reactor with a base pressure of above 100 torr and introducing $O_3$ in the reactor to decompose and recompose the adsorbed TEOS, thus depositing the oxide layer on the semiconductor substrate.

3. A method as defined by claim 2, wherein before the adsorption of TEOS, the semiconductor substrate is cleaned and annealed in the reactor.

4. A method as defined by claim 3, wherein the semiconductor substrate is cleaned in an HCl solution.

5. A method as defined by claim 4, wherein the semiconductor substrate is annealed in the reactor in an atmosphere of $O_3$.

6. A method as defined by claim 5, wherein the semiconductor substrate is annealed in a temperature of 500 to 600° C.

7. A method as defined by claim 1, wherein the oxide layer is deposited in a thickness of a few Å.

* * * * *